(12) United States Patent
Pressel et al.

(10) Patent No.: US 8,779,583 B2
(45) Date of Patent: Jul. 15, 2014

(54) SEMICONDUCTOR DEVICE AND MANUFACTURING METHOD

(75) Inventors: Klaus Pressel, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/595,049

(22) Filed: Aug. 27, 2012

(65) Prior Publication Data
US 2012/0319304 A1 Dec. 20, 2012

Related U.S. Application Data

(62) Division of application No. 12/179,217, filed on Jul. 24, 2008, now Pat. No. 8,338,936.

(51) Int. Cl.
| | |
|---|---|
| *H01L 23/34* | (2006.01) |
| *H01L 23/00* | (2006.01) |
| *H01L 23/538* | (2006.01) |
| *B81B 7/02* | (2006.01) |
| *G01L 9/00* | (2006.01) |
| *B81C 1/00* | (2006.01) |
| *H01L 21/56* | (2006.01) |
| *H01L 25/16* | (2006.01) |
| *H01L 21/683* | (2006.01) |
| *H01L 23/31* | (2006.01) |
| *G01P 1/02* | (2006.01) |
| *H01L 25/00* | (2006.01) |
| *H04R 1/04* | (2006.01) |
| *H01L 23/498* | (2006.01) |

(52) U.S. Cl.
CPC ....... *G01P 1/023* (2013.01); *H01L 2924/01072* (2013.01); *H01L 24/97* (2013.01); *H01L 2924/01006* (2013.01); *H01L 2924/19042* (2013.01); *H01L 2924/01087* (2013.01); *H01L 2224/76155* (2013.01); *H01L 2924/19041* (2013.01); *H01L 2924/01046* (2013.01); *H01L 2924/12044* (2013.01); *H01L 23/5389* (2013.01); *B81B 7/02* (2013.01); *H01L 2924/01027* (2013.01); *H01L 2924/01079* (2013.01); *H01L 2224/82039* (2013.01); *H01L 2224/24137* (2013.01); *H01L 2223/6677* (2013.01); *H01L 24/96* (2013.01); *H01L 2924/10329* (2013.01); *H01L 2924/01024* (2013.01); *H01L 2924/15174* (2013.01); *H01L 2224/97* (2013.01); *H04R 1/04* (2013.01); *H04R 2201/003* (2013.01); *H01L 2924/01047* (2013.01); *H01L 2924/01033* (2013.01); *G01L 9/0042* (2013.01); *H01L 2924/01023* (2013.01); *H01L 2924/01078* (2013.01); *H01L 2924/14* (2013.01); *H01L 2924/01005* (2013.01); *H01L 2924/01032* (2013.01); *H01L 2924/01029* (2013.01); *B81C 1/0023* (2013.01); *H01L 21/568* (2013.01); *H01L 25/16* (2013.01); *H01L 2924/014* (2013.01); *B81C 2203/0154* (2013.01); *H01L 2924/01082* (2013.01); *H01L 21/6835* (2013.01); *H01L 2924/15311* (2013.01); *H01L 23/3128* (2013.01); *B81B 2207/095* (2013.01); *H01L 23/5384* (2013.01); *H01L 2924/01013* (2013.01); *H01L 23/49816* (2013.01); *H01L 2924/00013* (2013.01); *B81B 2207/092* (2013.01); *H01L 2924/12041* (2013.01); *H01L 25/50* (2013.01)
USPC .... 257/723; 257/684; 257/691; 257/E23.125; 438/106; 438/127

(58) Field of Classification Search
USPC ......... 257/666, 678, 679, 684, 691, 693, 701, 257/702, 704, 723, 728, 731, 778, 787, 257/E23.116, E23.119, E23.123, E23.124, 257/E23.125, E23.133
See application file for complete search history.

(56) References Cited

U.S. PATENT DOCUMENTS

| | | | |
|---|---|---|---|
| 6,013,949 A * | 1/2000 | Tuttle | 257/723 |
| 7,683,460 B2 | 3/2010 | Heitzer et al. | |
| 7,799,620 B2 | 9/2010 | Honda | |
| 8,008,787 B2 * | 8/2011 | Park et al. | 257/787 |
| 2002/0179921 A1 | 12/2002 | Cohn | |
| 2004/0150118 A1 | 8/2004 | Honda | |
| 2004/0178488 A1 | 9/2004 | Bolken et al. | |
| 2005/0045729 A1 * | 3/2005 | Yamazaki | 235/492 |
| 2005/0179142 A1 * | 8/2005 | Liu | 257/778 |
| 2005/0269687 A1 * | 12/2005 | Forcier | 257/701 |
| 2007/0026567 A1 | 2/2007 | Beer et al. | |
| 2007/0254411 A1 * | 11/2007 | Uhland et al. | 438/127 |
| 2008/0093720 A1 * | 4/2008 | Hiew et al. | 257/679 |

OTHER PUBLICATIONS

"Stacking Technique of Fully Wafer Level Process Without Thru-Silicon Via", Dr. Christian Val et al.

"Removing Wire—The Ultimate Goal of Systems Packaging", Dr. Leonard Schaper, CPMT Systems Packaging Workshop, Como, IT, Jan. 2007.

Non-Final Office Action mailed Jul. 20, 2011 in U.S. Appl. No. 12/179,217.
Non-Final Office Action mailed Dec. 15, 2011 in U.S. Appl. No. 12/179,217.
Final Office Action mailed Apr. 6, 2012 in U.S. Appl. No. 12/179,217.

\* cited by examiner

*Primary Examiner* — Eduardo A Rodela

(74) *Attorney, Agent, or Firm* — Dicke, Billig & Czaja, PLLC

(57) ABSTRACT

A semiconductor device and manufacturing method. One embodiment provides a semiconductor chip. An encapsulating material covers the semiconductor chip. A metal layer is over the semiconductor chip and the encapsulating material. At least one of a voltage generating unit and a display unit are rigidly attached to at least one of the encapsulating material and the metal layer.

20 Claims, 8 Drawing Sheets

SEMICONDUCTOR DEVICE AND MANUFACTURING METHOD

CROSS REFERENCE TO RELATED APPLICATIONS

This Utility patent application is a Divisional application of U.S. application Ser. No. 12/179,217, filed Jul. 24, 2008, which is incorporated herein by reference.

BACKGROUND

This invention relates to a semiconductor device and a method of manufacturing a semiconductor device.

Miniaturization is a continuing trend in integrated circuit packaging technology toward smaller scales for semiconductor devices. Various techniques may be used to produce smaller semiconductor packages, such as chip scale packaging, wafer level packaging or chip stacking.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
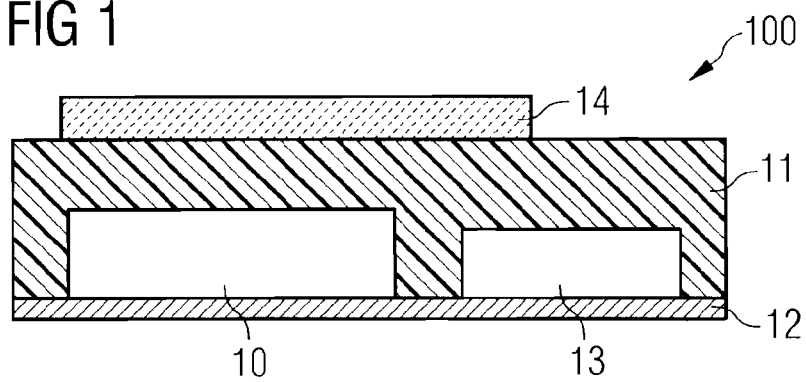
FIG. 1 schematically illustrates one embodiment of a device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices (which may be configured as a system or subsystem) containing one or more semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, magnetic field sensors, electro-magnetic field sensors, microphones etc. The semiconductor chips may be configured as antennas and/or discrete passives and/or chip stacks. Semiconductor chips in which such functional elements are embedded generally contain electronic circuits which serve for driving the functional elements or further processing signals generated by the functional elements. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The devices described below may include at least one of a display unit and a voltage generating unit. A display unit may be a unit for presentation of information for visual reception. There are various types of display units, for example flat panel displays, light-emitting diode (LED) displays, organic light-emitting diode (OLED) displays, plasma display panels (PDP), liquid crystal displays (LCD), thin-film transistor (TFT) displays, vacuum fluorescent (VF) displays, surface-conducting electron-emitter (SED) displays etc. The voltage generating unit may, for example, be implemented as a (rechargeable) battery, a solar cell or a microreactor. A microreactor (or microstructured reactor or microchannel reactor) is a unit in which chemical reactions take place in a confinement with typical lateral dimensions below 1 mm. One form of such confinement are microchannels.

Furthermore, the devices may include a sense unit, an input unit, an output unit and/or an external contact unit. The sense unit may, for example, be a pressure sensor, a rotation sensor, a magnetic field sensor, an electro-magnetic field sensor or an acceleration sensor. The input unit may, for example, be an antenna, a keypad, a touch screen or a microphone. The output unit may, for example, be an antenna, a loudspeaker or a vibrator. The external contact unit may be accessible from outside the device and may thus allow electrical contact to be made with the semiconductor chips and other electrical components included in the device. The external contact unit may, for example, contain contacts for SIM (Subscriber Identity Module) cards or may be a connector, for example a USB (Universal Serial Bus) connector.

The semiconductor chips or at least parts of the semiconductor chips may be covered with an encapsulating material, which may be electrically insulating. The encapsulating material may be any appropriate duroplastic, thermoplastic or thermosetting material or laminate (prepreg) and may contain filler materials. Various techniques may be employed to cover the semiconductor chips with the electrically insulating material, for example compression molding, injection molding, powder molding, potting, dispensing, jetting or lamination.

One or more metal layers may be placed over the semiconductor chip and/or the encapsulating material. The metal layers may, for example, be used to produce a redistribution layer. The metal layers may be used as wiring layers to make electrical contact with the semiconductor chips from outside the devices and/or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metal, for example aluminum, nickel, palladium, silver, tin, gold or copper, or metal alloy may be used as the material. The metal layers need not be homogenous or manufactured from just one material, that is to say various compositions and concentrations of the materials contained in the metal layers are possible. Furthermore, the metal layers may be arranged above or below or between electrically insulating layers.

FIG. 1 schematically illustrates a device 100 in cross section. The device 100 includes at least one semiconductor chip 10 and an encapsulating material 11 covering the semiconductor chip 10. A metal layer 12 is placed over the semiconductor chip 10 and the encapsulating material 11. The device 100 further includes at least one of a voltage generating unit 13 and a display unit 14, which are rigidly attached to at least one of the encapsulating material 11 and the metal layer 12.

Figure 2A:
FIGS. 2A to 2D schematically illustrate one embodiment of a method to produce a device.
Figure 2B:
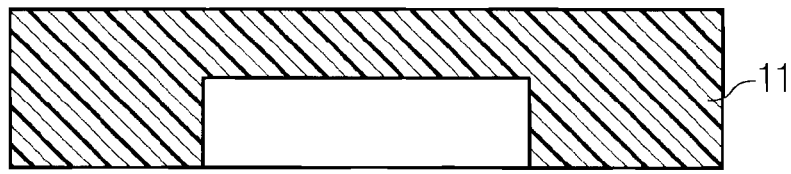
Figure 2C:
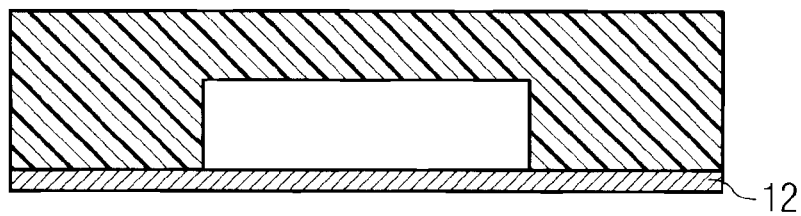
Figure 2D:
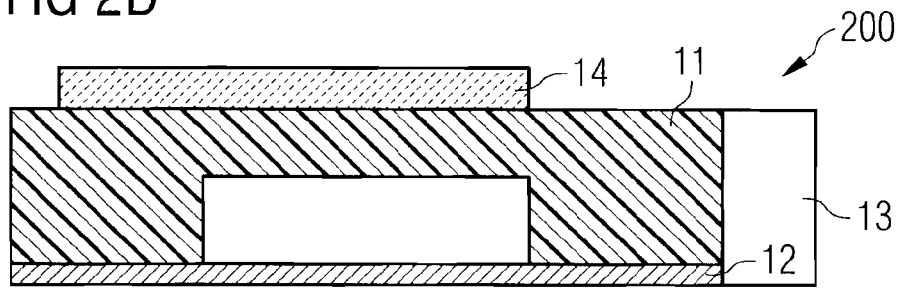

FIGS. 2A to 2D schematically illustrate a method for manufacturing a device 200. A cross section of the device 200 obtained by the method is illustrated in FIG. 2D. Firstly, a semiconductor chip 10 is provided (see FIG. 2A). An encapsulating material 11 is applied to the semiconductor chip 10 (see FIG. 2B), and a metal layer 12 is applied over the semiconductor chip 10 and the encapsulating material 11 (see FIG. 2C). At least one of a voltage generating unit 13 and a display unit 14 are rigidly attached to at least one of the encapsulating material 11 and the metal layer 12 (see FIG. 2D).

Figure 3A:
FIGS. 3A to 3J schematically illustrate one embodiment of a method to produce a device.
Figure 3B:
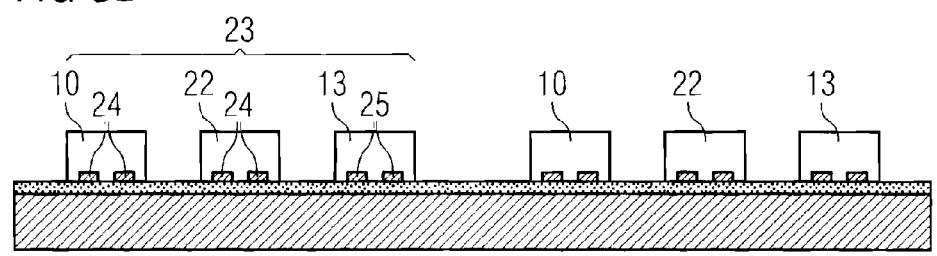
Figure 3C:
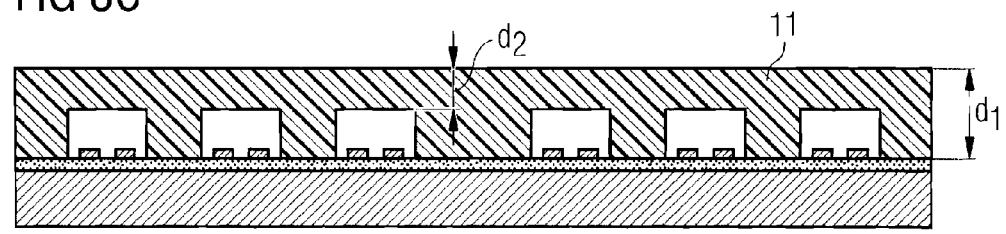
Figure 3D:
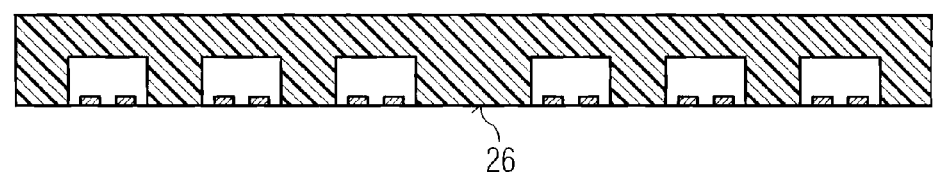
Figure 3E:
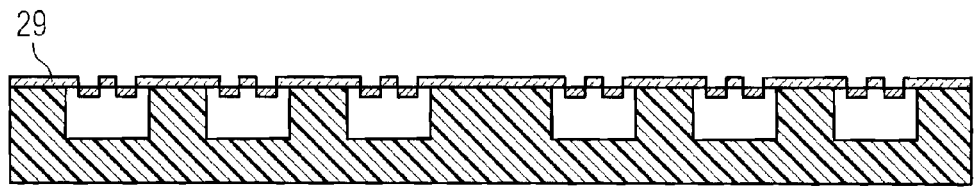
Figure 3F:
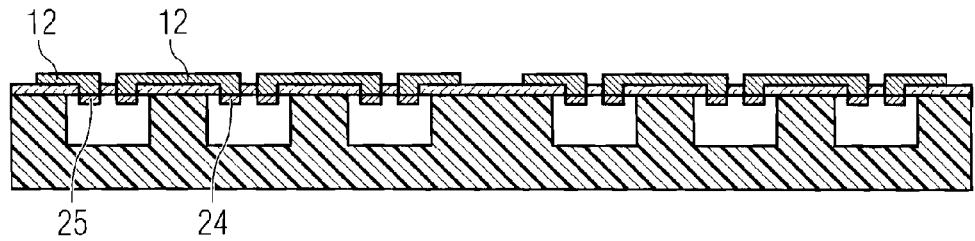
Figure 3G:
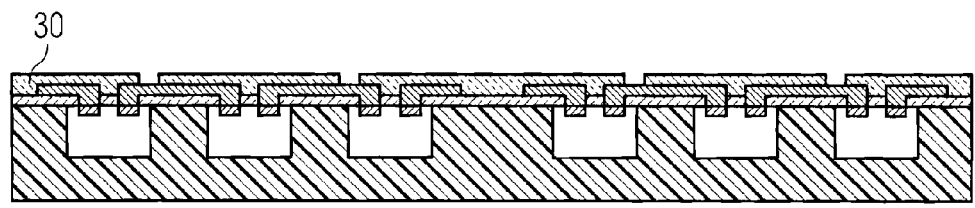
Figure 3H:
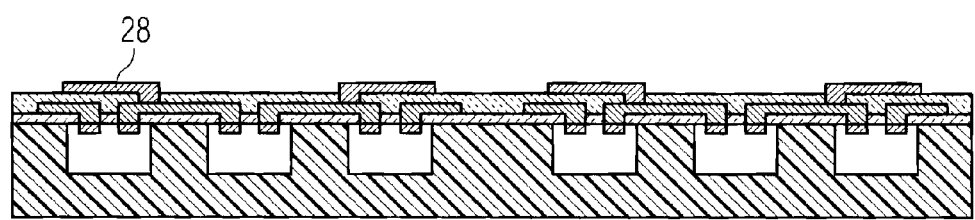
Figure 3I:
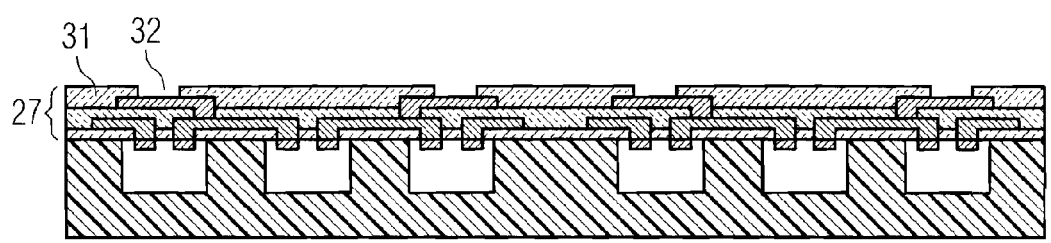
Figure 3J:
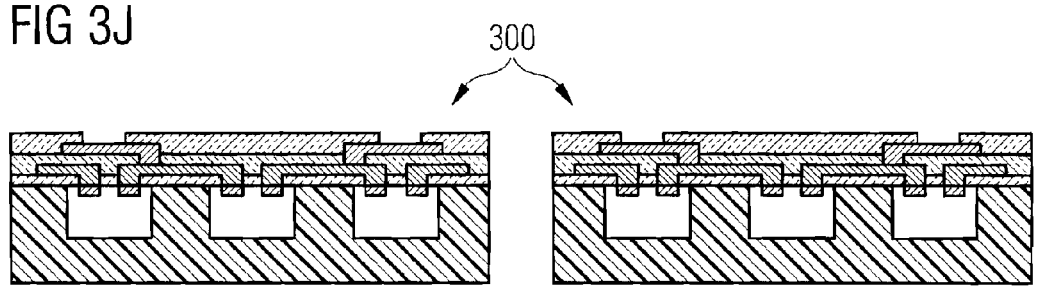

FIGS. 3A to 3J schematically illustrate a method for manufacturing a device 300, a cross section of which is illustrated in FIG. 3J. The device 300 is an implementation of the device 100. The details of the device 300 that are described below can therefore be likewise applied to the device 100. Furthermore, the method illustrated in FIGS. 3A to 3J is an implementation of the method illustrated in FIGS. 2A to 2D. The details of the production method that are described below can therefore be likewise applied to the method of FIGS. 2A to 2D.

In order to manufacture the device 300, a carrier 20 is provided as illustrated in FIG. 3A. The carrier 20 may be a plate made of a rigid material, for example a metal, such as nickel, steel or stainless steel, laminate, film or a material stack. The carrier 20 may have at least one flat surface on which components of the device 300 can be placed. The shape of the carrier 20 is not limited to any geometric shape, for example the carrier 20 may be round or square-shaped. The carrier 20 may have any appropriate size. An adhesive tape 21, for example a double sided sticky tape, may be laminated onto the carrier 20.

As illustrated in FIG. 3B, at least two semiconductor chips 10, at least two further semiconductor chips 22 and at least two voltage generating units 13 as well as possibly further semiconductor chips and/or components are placed over the carrier 20. The semiconductor chips 10, 22 and the voltage generating units 13 can be fixed on the adhesive tape 21. For attaching the semiconductor chips 10, 22 and the voltage generating units 13 to the carrier 20, other kinds of attaching materials may in one embodiment be used. Groups 23 each containing one of the semiconductor chips 10, one of the semiconductor chips 22 and one of the voltage generating units 13 may be arranged in an array. Any suitable array of the groups 23 may be placed on the carrier 20 (only two of the groups 23 are illustrated in FIG. 3B). The groups 23 may additionally contain further components which are not illustrated in FIG. 3B.

The semiconductor chips 10 and 22 are relocated on the carrier 20 in larger spacing as they have been in the wafer bond. The semiconductor chips 10 may have been manufactured on the same semiconductor wafer, but may in one embodiment have been manufactured on different wafers. Furthermore, the semiconductor chips 10 may be physically identical, but may also contain different integrated circuits and/or represent other components. The same may hold true for the semiconductor chips 22. The functions and dimensions of the semiconductor chips 10 may be different from the functions and dimensions of the semiconductor chips 22.

The semiconductor chips 10 and 22 have active main surfaces and may be arranged over the carrier 20 with their active main surfaces facing the carrier 20. The semiconductor chips 10 and 22 may have contact pads 24 located on their active main surfaces. The integrated circuits embedded in the semiconductor chips 10 and 22 can be electrically accessed via the contact pads 24. The voltage generating unit 13 may have contact pads 25, at which the voltage generated by the voltage generating unit 13 is provided during operation. The contact pads 25 may face the carrier 20. The contact pads 24 and 25 may be made of a metal, for example aluminum or copper. In FIG. 3B each of the semiconductor chips 10, 22 and the voltage generating units 13 contains two contact pads 24 or 25. In one embodiment, the semiconductor chips 10, 22 and the voltage generating units 13 may contain any number of contact pads 24 or 25.

The voltage generating unit 13 may, for example, be implemented as a battery, a rechargeable battery, a solar cell or a microreactor. During the operation of the device 300, the voltage generating unit 13 may provide a supply voltage for the operation of the semiconductor chips 10 and 22.

After the semiconductor chips 10, 22 and the voltage generating units 13 have been mounted on the carrier 20, they are covered with an encapsulating material 11 thereby forming a layer of the encapsulating material 11 as illustrated in FIG. 3C. For example, the encapsulating material 11 may be a duroplastic or thermosetting mold material. The gaps between the semiconductor chips 11, 22 and the voltage generating units 13 are also filled with the mold material 11. The mold material 11 may be based on an epoxy material and may contain a filling material consisting of small particles of glass (SiO$_2$) or other electrically insulating mineral filler materials like Al$_2$O$_3$ or organic filler materials. Compression molding, injection molding, powder molding or other appropriate molding techniques or other casting techniques may be employed to apply the mold material 11. The thickness $d_1$ of the layer of the mold material 11 may be in the range from 300 to 1000 μm, but may also be outside this range. The mold material 11 covering the top surface of the highest component among the semiconductors chips 10, 22 and the voltage generating unit 13 may have a thickness $d_2$ greater than 150 μm.

As an alternative to the mold material, another polymer material may be used as the encapsulating material 11 to cover the semiconductor chips 10, 22 and the voltage generating units 13. The polymer material 11 may have the shape of an electrically insulating foil or sheet, which is laminated on top of the semiconductor chips 10, 22 and the voltage generating units 13 as well as the carrier 20. Heat and pressure may be applied for a time suitable to attach the polymer foil or sheet 11 to the underlying structure. The gaps between the semiconductor chips 10, 22 and the voltage generating units 13 are also filled with the polymer material 11. The polymer material 11 may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the polymer material 11 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10, 22 and the voltage generating units 13 and hardened during a heat-treatment. For the lamination of the prepreg the same or similar processes can be used as in PCB manufacturing.

The semiconductor chips 10, 22 and the voltage generating units 13 covered with the encapsulating material 11 are released from the carrier 20, and the adhesive tape 21 is pealed from the semiconductor chips 10, 22 and the voltage generating units 13 as well as from the encapsulating material 11 as illustrated in FIG. 3D. The adhesive tape 21 may feature thermo-release properties, which allow the removal of the adhesive tape 21 during a heat-treatment. The removal of the adhesive tape 21 from the carrier 20 is carried out at an appropriate temperature, which depends on the thermo-release properties of the adhesive tape 21 and is usually higher than 150° C.

After the release of the carrier 20 and the adhesive tape 21 the surfaces of the semiconductor chips 10, 22 and the voltage generating units 13, which were previously attached to the carrier 20, as well as the bottom surface of the encapsulating material 11 form a common planar surface 26. As illustrated in FIGS. 3E to 3I, a redistribution layer 27 may be applied to the surface 26. One function of the redistribution layer 27 is to electrically connect the semiconductor chips 10, 22 and the voltage generating unit 13 among each other. For example, this enables the voltage generating unit 13 to provide the supply voltage to the semiconductor chips 10 and 22.

In the present embodiment, the redistribution layer 27 includes metal layers 12 and 28 and dielectric layers 29, 30 and 31. The dielectric layer 29 is deposited on the planar surface 26 (see FIG. 3E). The metal layer 12 is applied to the dielectric layer 29, with electrical contacts being produced to the contact pads 24 and 25 that are embedded in the semiconductor chips 10, 22 and the voltage generating units 13 (see FIG. 3F). The dielectric layer 29 has openings in order to produce these contacts. The metal layer 12 may have the function of a wiring layer to couple the semiconductor chips 10, 22 and the voltage generating units 13 to each other and/or to other components.

The dielectric layer 30 is subsequently applied to the dielectric layer 29 and the metal layer 12 (see FIG. 3G). The metal layer 28 is applied to the dielectric layer 30, with electrical contacts being produced to the metal layer 12 (see FIG. 3H). The dielectric layer 30 has openings in order to produce these contacts.

The dielectric layer 31 is subsequently applied to the dielectric layer 30 and the metal layer 28 (see FIG. 3I). The dielectric layer 31 is opened in areas where external contact pads 32 are arranged. The external contact pads 32 may be used to electrically couple the semiconductor chips 11, 22 and the voltage generating unit 13 to other components external of the device 300. Instead of the two wiring layers 12 and 28 as illustrated in FIG. 3I, it is also possible to use just one or more than two wiring layers if required.

The dielectric layers 29 to 31 may be fabricated in various ways. For example, the dielectric layers 29 to 31 can be deposited from a gas phase or from a solution, or can be laminated onto the underlying structure. Furthermore, thin-film technology methods or a standard PCB industry process flow can be used for application of the dielectric layers 29 to 31. Each of the dielectric layers 29 to 31 may be up to 10 μm thick. In order to make electrical contacts, the dielectric layers 29 to 31 may, for example, be opened by using photolithographic methods and/or etching methods and/or laser techniques.

The metal layers 12 and 28 may, for example, be fabricated by using metallization followed by structuring of the metallization layer in order to form the conductor tracks of the wiring layer. Any desired metal, for example aluminum, nickel, palladium, silver, tin, gold or copper, or metal alloy may be used as the material.

The metal layers 12 and 28 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer, for example a copper layer.

Another technique that may be employed to generate the metal layers 12 and 28 is laser direct structuring. In case of laser direct structuring an electrically insulating polymer foil is attached on the desired surface. The circuit definition is done by using a laser beam, which activates special additives in the polymer foil in order to allow subsequent selective plating.

Solder deposits may be placed onto the external contact pads 32 (not illustrated). The solder deposits may be applied to the external contact pads 32 by "ball placement", in which pre-shaped balls composed of solder material are applied to the external contact pads 32. As an alternative to "ball placement", the solder deposits may, for example, be applied by using stencil printing with a solder paste, followed by a heat-treatment process. The solder material may, for example, be composed from at least one of the following materials: SnPb, SnAg, SnAgCu, SnAgCuNi, SnAu, SnCu and SnBi. The solder deposits may be used as external contact elements to electrically couple the device 300 to other components. The dielectric layer 31 may be a solder resist layer that prevents solder from bridging between the conductor tracks and creating short circuits. The dielectric layer 31 also provides protection from the environment.

As illustrated in FIG. 3J, the devices 300 are separated from one another by separation of the encapsulating material 11 and the redistribution layer 27, for example by sawing, cutting, milling, etching or a laser beam.

The devices 300 manufactured by the method described above may be fan-out type packages. The layer of the encapsulating material 11 allows the redistribution layer 27 to extend beyond the outline of the semiconductor chips 10 and/or 22. The external contact pads 32 therefore do not need to be arranged within the outline of the semiconductor chip 10 or 22, but can be distributed over a larger area. The increased area which is available for arrangement of the external contact pads 32 as a result of the layer of the encapsulating material 11 means that the external contact pads 32 cannot only be arranged at a great distance from one another, but that the maximum number of external contact pads 32 which can be arranged there is likewise increased compared to the situation when all the external contact pads 32 are arranged within the outline of the semiconductor chips 10 and 22.

The semiconductor chips 10 and 22 included in the device 300 may have different functions. They may be used for computing, signal processing, controlling, data storage or any other task. For example, the device 300 may be included in a mobile cellular phone. In this case, the semiconductor chip 10 may be a radio-frequency (RF) chip, which converts received RF signals to baseband and/or converts signals to be transmitted to a transmission frequency. The semiconductor chip 22 may be a baseband chip, which processes the received signals after they have been mixed to baseband by the RF chip 10. Furthermore, the baseband chip 22 may process baseband signals which are to be transmitted and may transfer these signals to the RF chip 10 which mixes the baseband signals with the transmission frequency. The voltage generating unit 13 may produce the supply voltage which is needed to operate the RF chip 10 and the baseband chip 22.

It is obvious to a person skilled in the art that the device 300 illustrated in FIG. 3J and the manufacturing thereof as described above are only intended to be an exemplary embodiment, and many variations are possible. For example, more than two semiconductor chips or passives of different types may be included in the same device 300. The semiconductor chips and passives may differ in function, size, manufacturing technology etc.

Figure 4A:
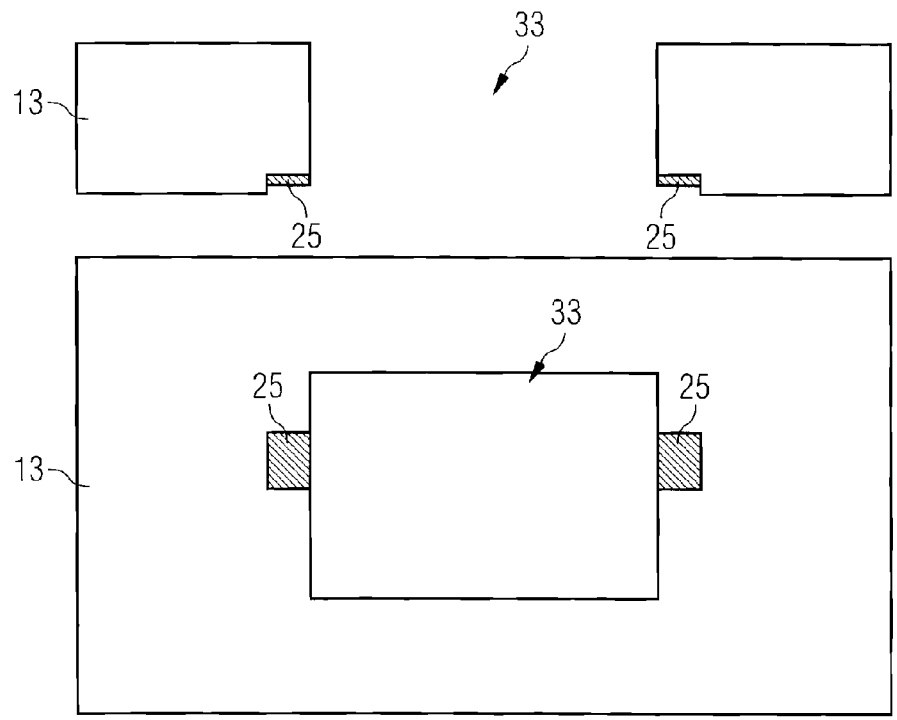
FIGS. 4A to 4C schematically illustrate one embodiment of a method to produce a device.
Figure 4B:
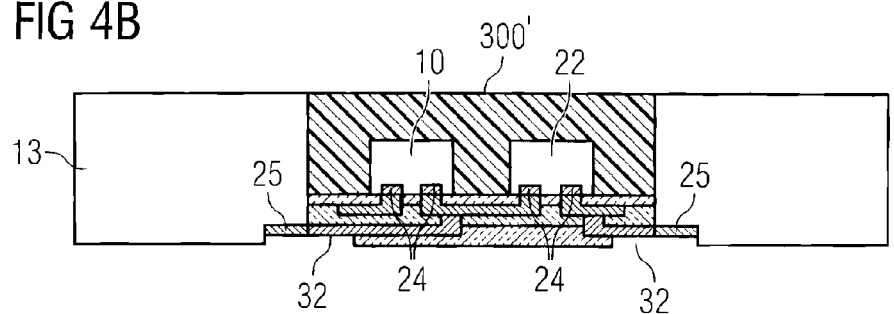
Figure 4C:
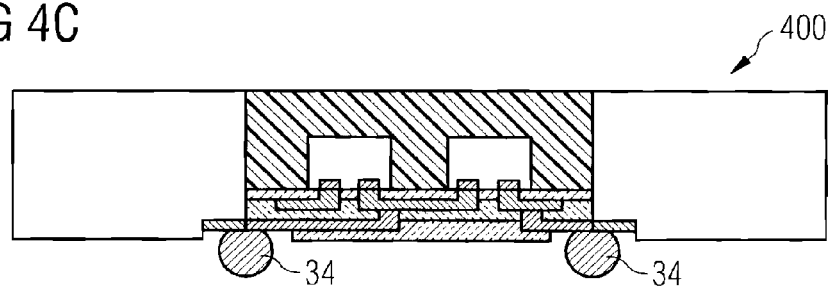

Another embodiment of the device 300 and the fabrication method thereof is illustrated in FIGS. 4A to 4C. One method for manufacturing a device 400 is illustrated there, a cross section of which is illustrated in FIG. 4C.

In FIG. 4A, one embodiment of the voltage generating unit 13 is illustrated in cross section (top) and plan view (bottom). The voltage generating unit 13 of the present embodiment exhibits a recess 33. Furthermore, the voltage generating unit 13 has at least two contact pads 25, at which the voltage generated by the voltage generating unit 13 can be provided. The voltage generating unit 13 may, for example, include one or more rechargeable batteries, solar cells and/or microreactors.

As illustrated in FIG. 4B, a device 300' may be fit into the recess 33. The device 300' may be similar to the device 300 described above and may be produced by using a similar production method. In contrast to the device 300, the device 300' does not include a voltage generating unit. An adhesive material, for example glue, may be used to rigidly attach the device 300' to the voltage generating unit 13. For example, the adhesive material may be applied to one or more of the side walls of the device 300' and/or the recess 33 before the device 300' is inserted into the recess 33.

The device 300' may have at least two external contact pads 32 which are located next to the contact pads 25 of the voltage generating unit 13 after the insertion of the device 300' into the recess 33.

In order to electrically couple the contact pads 25 of the voltage generating unit 13 to the external contact pads 32 of the device 300', a solder deposit 34 may be placed onto each of the contact pads 25 and the neighboring external contact pad 32 as illustrated in FIG. 4C. The solder deposits 34 may be applied as solder balls. Instead of ball placement, the solder deposits 34 may, for example, be applied by using stencil printing or dispensing with a solder paste, followed by a heat-treatment process. The solder material may, for example, be composed from at least one the following materials: SnPb, SnAg, SnAgCu, SnAgCuNi, SnAu, SnCu and SnBi. The solder deposits 34 ensure that the semiconductor chips 10 and 22 integrated in the device 300' are supplied with the supply voltage generated by the voltage generating unit 13. Instead of the solder deposits 34, other electrically conductive materials may be used to electrically connect the contact pads 25 to the external contact pads 32. For this purpose electrically conductive adhesives or electrically conductive ink applied by ink jet printing may, for example, be used.

Instead of the recess 33, the voltage generating unit 13 may have any other interface to which the device 300' may be attached.

Figure 5:
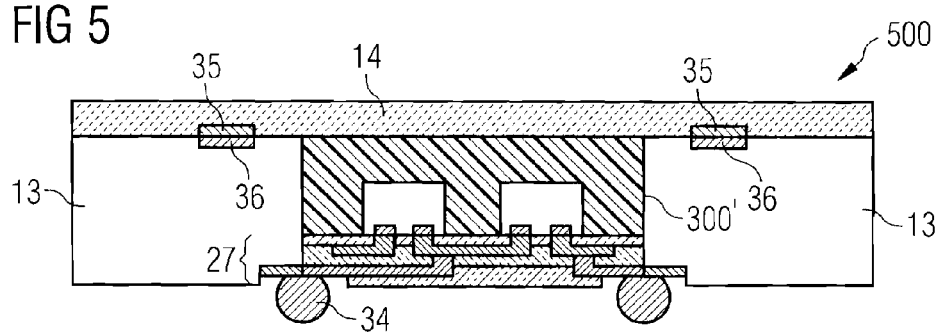
FIG. 5 schematically illustrates one embodiment of a device.

FIG. 5 schematically illustrates a device 500 as a development of the device 400 illustrated in FIG. 4. In addition to the components of the device 400, the device 500 includes a display unit 14, which may, for example, contain a flat panel display, a light-emitting diode display, an organic light-emitting diode display, a plasma display panel, a liquid crystal display, a thin-film transistor display, a vacuum fluorescent display, a surface-conducting electron-emitter display or any other kind of visual display.

The display unit 14 may be rigidly attached to a surface of the voltage generating unit 13, for example by gluing. The supply voltage provided by the voltage generating unit 13 may be used to operate the display unit 14. In order to electrically couple the display unit 14 to the voltage generating unit 13, the display unit 14 may have contact pads 35, which are located next to contact pads 36 of the voltage generating unit 13. The electrical connections between the contact pads 35 and 36 may, for example, be produced by reflow soldering, vacuum soldering, diffusion soldering or adhesive bonding by using an electrically conductive adhesive. In case of an electrically conductive adhesive, it is possible to use electrically conductive adhesives which may be based on epoxy resins and be enriched with gold, silver, nickel or copper in order to produce the electrical conductivity. The electrically conductive adhesive may be hardened during a heat-treatment. The temperature during the heat-treatment may be in the range from 70 to 200° C. and in one embodiment below 150° C. The display unit 14 may be electrically coupled to the redistribution layer 27 of the device 300' (not illustrated). The electrical connection may be formed as described above and/or by through-connections as described further below in connection with the device 300''''.

Figure 6A:
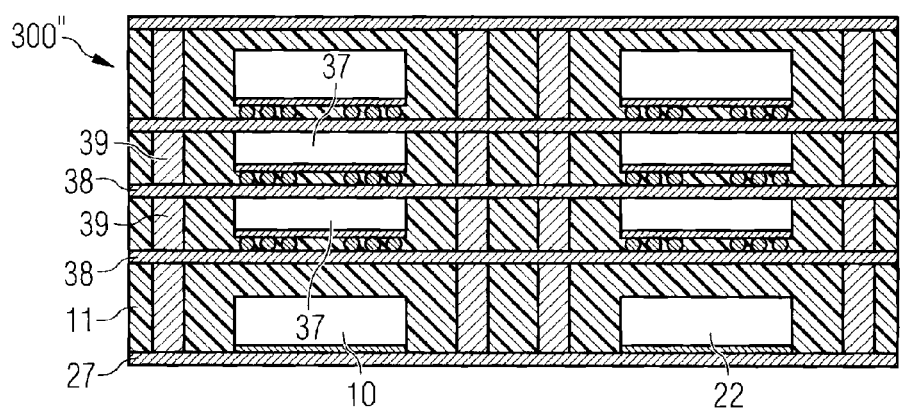
FIGS. 6A and 6B schematically illustrate one embodiment of a method to produce a device.
Figure 6B:
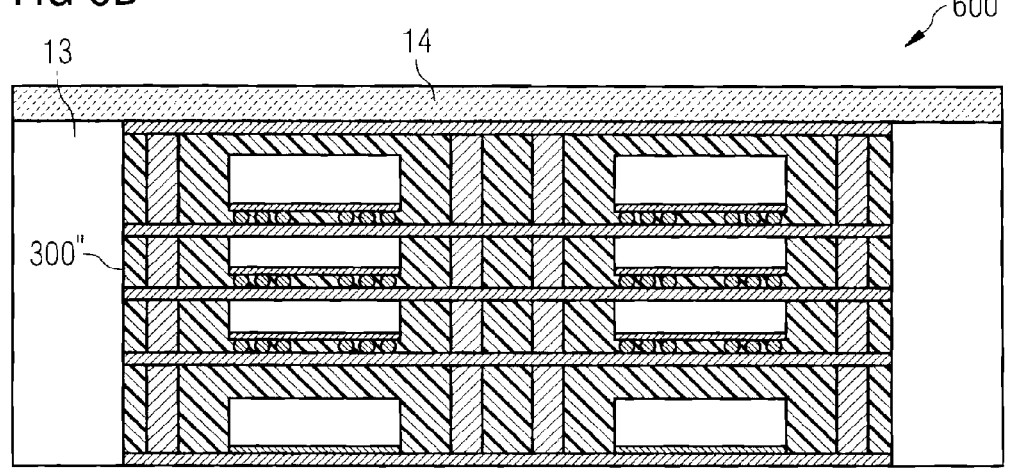
Figure 7A:
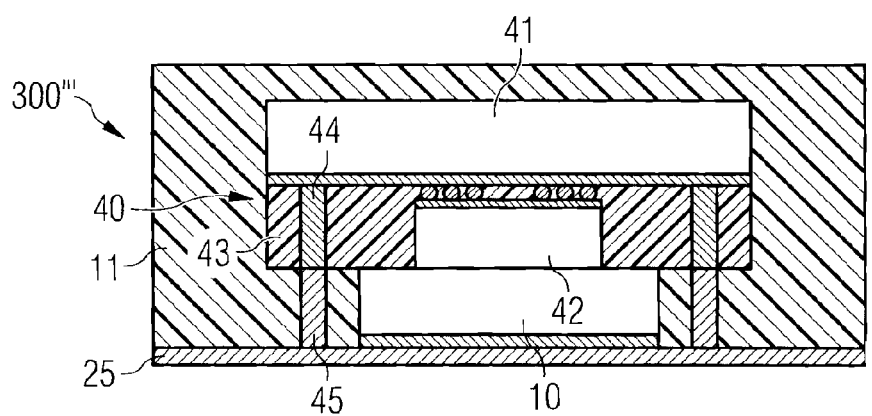
FIGS. 7A and 7B schematically illustrate one embodiment of a method to produce a device.
Figure 7B:
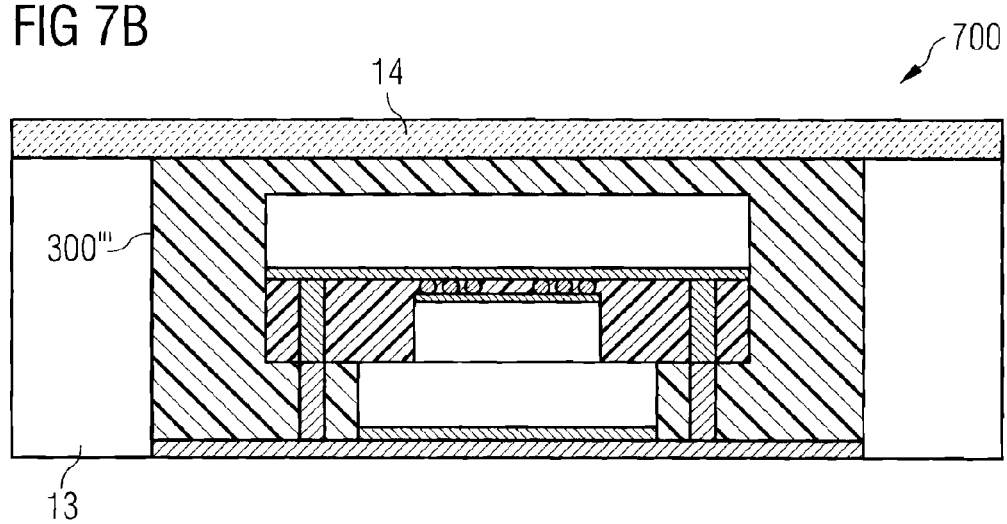

In FIGS. 6A and 6B as well as FIGS. 7A and 7B variations of the device 500 are illustrated. In FIG. 6B a device 600 is schematically illustrated which is similar to the device 500, but includes a device 300'' instead of the device 300'. The device 300'' (in one embodiment the packaging of the semiconductor chips 10 and 22) is manufactured by employing the method illustrated in FIGS. 3A to 3J. Additionally one or more semiconductor chips 37 are stacked on top of the semiconductor chips 10 and 22. Redistribution layers 38 and through-connections 39 in the encapsulating material 11 are provided to electrically couple the semiconductor chips 10, 22 and 37 according to their functions to each other. The device 300″ may be inserted into the recess 33 of the voltage generating unit 13 as illustrated in FIG. 6B. Furthermore, the display unit 14 may be attached to the device 300″. The electrical connections between the device 300″, the voltage generating unit 13 and the display unit 14 are not illustrated in FIG. 6B. The through-connections 39 of the device 300″ may also be used to electrically couple the display unit 14 to the redistribution layer 27.

In FIG. 7A a device 300‴ is schematically illustrated which is manufactured by employing the method illustrated in FIGS. 3A to 3J. In one embodiment the semiconductor chip 10 of the device 300‴ is covered with the encapsulating material 11 and the redistribution layer 25 is manufactured as described in connection with the FIGS. 3A to 3J. On top of the semiconductor chip 10 a package 40 is stacked containing for example two semiconductor chips 41 and 42. The semiconductor chips 41 and 42 are arranged such that their active main surfaces face each other. Furthermore, the package 40 includes an encapsulating material 43 covering the semiconductor chips 41 and 42. Through-connections 44 and 45 electrically couple the package 40 to the redistribution layer 25. Furthermore, a redistribution layer may be applied to the bottom face of the package 40 (not illustrated). The device 300‴ may be inserted into the recess 33 of the voltage generating unit 13 as illustrated in FIG. 7B. Furthermore, the display unit 14 may be attached to the encapsulating material 11 of the device 300‴. The electrical connections between the device 300‴, the voltage generating unit 13 and the display unit 14 are not illustrated in FIG. 7B.

It may be provided that a sense unit, an input unit, an output unit and/or an external contact unit are rigidly attached to one of the device 300, 400, 500, 600 and 700.

Figure 8A:
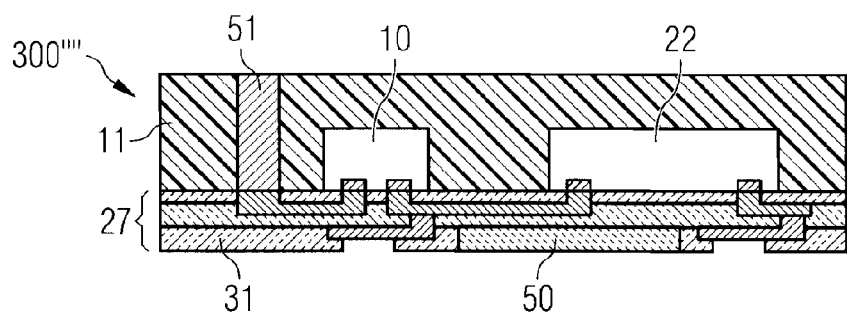
FIGS. 8A and 8B schematically illustrate one embodiment of a method to produce a device.
Figure 8B:
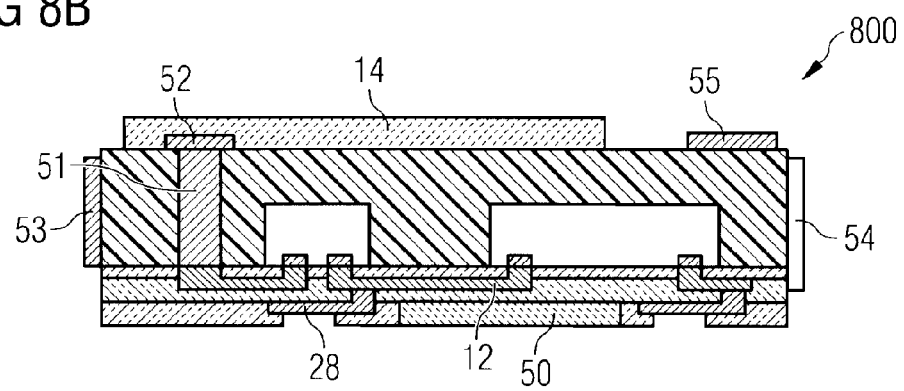

FIGS. 8A and 8B schematically illustrate a method for manufacturing a device 800. A cross section of the device 800 obtained by the method is illustrated in FIG. 8B. As illustrated in FIG. 8A, a device 300″″ that is similar to the device 300 is provided. The device 300″″ may have been manufactured by using the manufacturing method described above in connection with FIGS. 3A to 3J. In contrast to the device 300, the device 300″″ may not include a battery or microreactor, but one or more solar cells 50 are integrated into the redistribution layer 27 of the device 300″″. The solar cell 50 may have the form of a foil which can be integrated into the dielectric layer 31. During operation of the device 800, the solar cell 50 provides the supply voltage for operating the semiconductor chips 10 and 22 as well as other components of the device 800. The solar cell 50 may be electrically coupled to the semiconductor chips 10 and 22 via the metal layers 12 and 28 and may charge a battery or capacitor (not illustrated).

One or more through-connections 51 may be integrated in the encapsulating material 11 of the device 300″″ (only one through-connection 51 is illustrated in FIG. 8A). In order to manufacture the through-connections 51, through-holes may be formed in the encapsulating material 11. The through-holes may be drilled using a laser beam, an etching process or any other appropriate method. The aspect ratio of the through-holes, which is the ratio of their widths to their lengths, may be in the range from 1:1 to 1:20 and in one embodiment from 1:2 to 1:5. The widths of the through-holes may be in the range from 50 to 200 μm.

Before or after the release of the device 300″″ from the carrier 20 and the adhesive tape 21 (see FIG. 3D), the through-holes may be filled with an electrically conductive material, which may be a metal, such as copper, aluminum or gold, or a metal alloy, such as SnAg, SnAu or any solder material or any electrically conductive paste. The electrically conductive material forms the through-connections 51 in the encapsulating material 11. An alternative method for production of the through-connections 51 provides that the through-holes are not completely filled with the electrically conductive material, but only the walls of the through-holes are coated with the electrically conductive material. For example, a seed layer, such as a palladium layer, is first deposited onto the surfaces of the through-holes. Then a layer of copper may be electroless deposited onto the seed layer. This copper layer may have a thickness of less than 1 μm. Afterwards another layer of copper may be galvanically deposited, which may have a thickness of more than 5 μm. The electroless copper deposition may also be omitted. As a further alternative, the electrically conductive material may be sputtered onto the surfaces of the through-holes. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of, for example, more than 5 μm.

It may be provided that an electrically insulating material, such as epoxy, is filled into the through-holes coated with the electrically conductive layers. The electrically insulating material may protect the electrically conductive layers against corrosion.

As illustrated in FIG. 8B, a display unit 14 may be rigidly attached to the top surface of the encapsulating material 11, for example by gluing. The display unit 14 may have one or more contact pads 52, which may be electrically coupled to the through-connections 51. The through-connections 51 electrically couple the display unit 14 to the redistribution layer 27, the semiconductor chips 10, 22 and the solar cell 50. The electrical connections between the contact pads 52 and the through-connections 51 may, for example, be produced by reflow soldering, vacuum soldering, diffusion soldering or adhesive bonding by using an electrically conductive adhesive. In case of an electrically conductive adhesive, it is possible to use electrically conductive adhesives which may be based on epoxy resins and be enriched with gold, silver, nickel or copper in order to produce the electrical conductivity. The electrically conductive adhesive may be hardened during a heat-treatment. The temperature during the heat-treatment may be in the range from 70 to 200° C. and in one embodiment below 150° C.

An antenna 53, a microphone 54 and an external contact unit 55 as well as possibly further components, such as a camera unit for example, may be further rigidly attached to the encapsulating material 11 and/or the redistribution layer 27, for example by gluing. The external contact unit 55 may, for example, contain contacts for SIM (Subscriber Identity Module) cards or may be a USB (Universal Serial Bus) connector. The antenna 53, the microphone 54, the external contact unit 55 and the further components may be electrically coupled to the redistribution layer 27 (not illustrated in FIG. 8B). These electrical connections may, for example, be realized by further through-connections through the encapsulating material 11 (not illustrated). Furthermore, electrically conductive adhesive, electrically conductive ink applied by ink jet printing or solder deposits may be used for the electrical connections. The device 800 may further include a keypad, which may, for example, be integrated into the display unit 14 in the form of a touch screen. Some of the components (e.g., the antenna 53) of the device 800, which are attached to an outer surface of the encapsulating material 11 in the present embodiment, may also be covered by the encapsulating material 11, similar to the voltage generating unit 13 in FIGS. 3A to 3J.

The device 800 may, for example, be implemented into a mobile cellular phone. In this case, the semiconductor chips 10 and 22 may be an RF chip and a baseband chip, respectively. Moreover, the semiconductor chip 22 may have further tasks apart from baseband processing, for example controlling other components of the device 800 and power management. The device 800 as illustrated in FIG. 8B may include some or even all of the basic functions of a mobile cellular phone. It may not be necessary to mount the device 800 to a circuit board, such as a PCB (Printed Circuit Board).

Other applications of the devices 100 to 800 are, for example, car keys, tire pressure sensors and hearing aids.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a semiconductor chip having a first side and a second side directly opposite to the first side;
   an encapsulating material covering the semiconductor chip and directly contacting the first side of the semiconductor chip;
   a metal layer over the semiconductor chip and the encapsulating material, the metal layer directly contacting the second side of the semiconductor chip;
   a voltage generating unit rigidly attached to at least one of the encapsulating material and the metal layer; and
   a display unit rigidly attached to at least one of the encapsulating material and the metal layer,
   wherein the encapsulating material covers the voltage generating unit, and
   wherein the display unit is arranged over at least one of the semiconductor chip and the voltage generating unit.

2. The device of claim 1, wherein the voltage generating unit comprises at least one of a battery, a solar cell and a microreactor.

3. The device of claim 1, wherein the metal layer is electrically coupled to the voltage generating unit and the semiconductor chip.

4. The device of claim 1, wherein a face of the semiconductor chip and a face of the encapsulating material define a first plane and the metal layer is arranged on the first plane.

5. A method of making the device of claim 1, comprising:
   providing a semiconductor chip and a voltage generating unit;
   applying an encapsulating material to the semiconductor chip and the voltage generating unit; and
   applying a metal layer over at least two of the semiconductor chip, the encapsulating material and the voltage generating unit.

6. The method of claim 5, comprising:
   placing the semiconductor chip and the voltage generating unit on a carrier before the application of the encapsulating material; and
   removing the carrier from the semiconductor chip and the voltage generating unit after the application of the encapsulating material.

7. The method of claim 6, comprising applying the metal layer after the carrier is removed.

8. The method of claim 5, comprising gluing a display unit to the encapsulating material.

9. A device, comprising:
   a semiconductor chip having a first surface and a second surface directly opposite to the first surface, the second surface including contact pads;
   an encapsulating material covering the semiconductor chip and directly contacting the first surface of the semiconductor chip;
   a metal layer over the semiconductor chip and the encapsulating material, the metal layer directly contacting the contact pads of the semiconductor chip; and
   a voltage generating unit rigidly attached to at least one of the encapsulating material and the metal layer; and
   a display unit rigidly attached to at least one of the encapsulating material and the metal layer,
   wherein at least one of the voltage generating unit and the display unit is glued to the encapsulating material via an adhesive material, and
   wherein the display unit is arranged over at least one of the semiconductor chip and the voltage generating unit.

10. The device of claim 9, wherein the voltage generating unit comprises at least one of a battery, a solar cell and a microreactor.

11. The device of claim 9, wherein the metal layer is electrically coupled to the voltage generating unit and the semiconductor chip.

12. The device of claim 9, wherein a face of the semiconductor chip and a face of the encapsulating material define a first plane and the metal layer is arranged on the first plane.

13. A method of making the device of claim 9, comprising:
   providing a first semiconductor chip and a second semiconductor chip;
   covering the first and second semiconductor chips with an encapsulating material;

separating the first semiconductor chip from the second semiconductor chip by removing the encapsulating material partially; and rigidly attaching at least one of a voltage generating unit and a display unit to the encapsulating material.

14. The method of claim 13, comprising covering the voltage generating unit with the encapsulating material.

15. The method of claim 13, comprising gluing the display unit to the encapsulating material.

16. The method of claim 13, comprising applying the encapsulating material by molding or laminating.

17. A device, comprising:

a semiconductor chip having contact pads on a surface of the semiconductor chip;

an encapsulating material covering the semiconductor chip;

a metal layer over the semiconductor chip and the encapsulating material, the metal layer directly contacting the contact pads;

a voltage generating unit rigidly attached to at least one of the encapsulating material and the metal layer; and a display unit rigidly attached to the encapsulating material, wherein at least one of a sense unit, an input unit, an output unit and an external contact unit is rigidly attached to at least one of the encapsulating material and the metal layer, and wherein the display unit arranged over at least one of the semiconductor chip and the voltage generating unit.

18. The device of claim 17, wherein the sense unit comprises at least one of a pressure sensor, a rotation sensor, a magnetic field sensor, an electro-magnetic field sensor and an acceleration sensor.

19. The device of claim 17, wherein the input unit comprises at least one of an antenna, a keypad, a touch screen and a microphone.

20. The device of claim 17, wherein the output unit comprises at least one of an antenna, a loudspeaker and a vibrator.

* * * * *